(12) United States Patent
Lai et al.

(10) Patent No.: US 7,262,077 B2
(45) Date of Patent: Aug. 28, 2007

(54) CAPILLARY UNDERFILL AND MOLD ENCAPSULATION METHOD AND APPARATUS

(75) Inventors: Yin Men Lai, Seremban (MY); Choong Kooi Chee, Penang (MY); Edward Then, Penang (MY); Cheong Huat Ng, Penang (MY); Mun Fai Low, Penang (MY)

(73) Assignee: Intel Corporation, Santa Clara, CA (US)

( * ) Notice: Subject to any disclaimer, the term of this patent is extended or adjusted under 35 U.S.C. 154(b) by 615 days.

(21) Appl. No.: 10/675,921

(22) Filed: Sep. 30, 2003

(65) Prior Publication Data

US 2006/0214311 A1    Sep. 28, 2006

(51) Int. Cl.
*H01L 21/44* (2006.01)
(52) U.S. Cl. .............................. 438/108; 257/E21.503
(58) Field of Classification Search ................ 438/127, 438/108; 257/E21.503
See application file for complete search history.

(56) References Cited

U.S. PATENT DOCUMENTS

| | | | | |
|---|---|---|---|---|
| 6,117,797 A | * | 9/2000 | Hembree | 438/759 |
| 6,248,951 B1 | * | 6/2001 | Murali et al. | 174/521 |
| 6,546,620 B1 | * | 4/2003 | Juskey et al. | 29/840 |
| 6,649,446 B1 | * | 11/2003 | Goetz et al. | 438/110 |
| 2002/0008316 A1 | * | 1/2002 | Miyazaki | 257/701 |
| 2002/0089836 A1 | * | 7/2002 | Ishida et al. | 361/824 |
| 2003/0170450 A1 | * | 9/2003 | Stewart et al. | 428/343 |
| 2004/0056341 A1 | * | 3/2004 | Endo et al. | 257/678 |
| 2004/0121512 A1 | * | 6/2004 | Manepalli et al. | 438/106 |
| 2004/0159923 A1 | * | 8/2004 | Skokov et al. | 257/678 |

* cited by examiner

*Primary Examiner*—Scott B. Geyer
(74) *Attorney, Agent, or Firm*—Schwegman, Lundberg, Woessner & Kluth, P.A.

(57) ABSTRACT

A method of packaging a die includes attaching the die to a substrate; underfilling the space between the die and the substrate with a first material, and placing a second material in contact with at least a portion of the die and the substrate after underfilling the space between the die and substrate with the first material. A system includes a semiconductor package having a substrate, a die attached to the substrate, an underfill material positioned between the die and the substrate, and a molding material in contact with at least a portion of the substrate and the die. A heat sink is also in thermal contact with the semiconductor package.

27 Claims, 9 Drawing Sheets

CAPILLARY UNDERFILL AND MOLD ENCAPSULATION METHOD AND APPARATUS

FIELD OF THE INVENTION

The present invention relates generally to apparatus and methods for packaging a device. More particularly, it relates to the capillary underfill and mold encapsulation process used for packaging a device.

BACKGROUND OF THE INVENTION

Typically a large number of semiconductor devices are formed on wafers. The semiconductor devices are formed by repeating a number of basic operations on a wafer. The basic operations include layering, patterning, doping, and heat processing. The final semiconductor formed has many layers of material and includes as many as 10,000 or more individual transistors. Rather than make each semiconductor device individually, a number of devices are formed on a single wafer. The entire wafer is subjected to the basic operations discussed above in order to form hundreds of semiconductor chips or devices. Typically, after the semiconductor devices are formed, the semiconductor devices are tested and sorted. Next, the wafer is sliced and diced so that each individual semiconductor device is separated from the others formed on the wafer.

The individual semiconductor devices are formed on fragile material. As a result, the individual semiconductor devices are packaged, in part for physical protection. Packaging also dissipates the heat from the semiconductor and provides leads between the individual chip or die and an exterior portion of the package. The leads allow for electrical connection between the chip or die and a printed circuit board or other device.

There are many different types of packages. One common package is a flip chip which has a series of bumps or balls or leads formed in an array on a surface of the flip chip. The flip chip is attached to a substrate during packaging. The flip chip includes an inner layer dielectric (ILD) where the devices associated with the flip chip are formed. One method of packaging includes attaching the flip chip or die to the substrate and then encapsulating the flip chip or die in plastic or epoxy. Part of this packaging method includes a molded underfill (MUF) where the plastic or epoxy is forced into the gap between the flip chip and the substrate. A high clamping force is placed on top of the flip chip or die and a high transfer pressure is applied during the MUF process. The ILD is a fragile, thin film layer. The high clamping force and the high transfer pressure causes the ILD to crack during the MUF process. Cracks in the ILD result in failures of the flip chip. In some instances, these failures may be latent failures which manifest themselves only after manufacture. Of course part failures are never desirable.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

Figure 1:
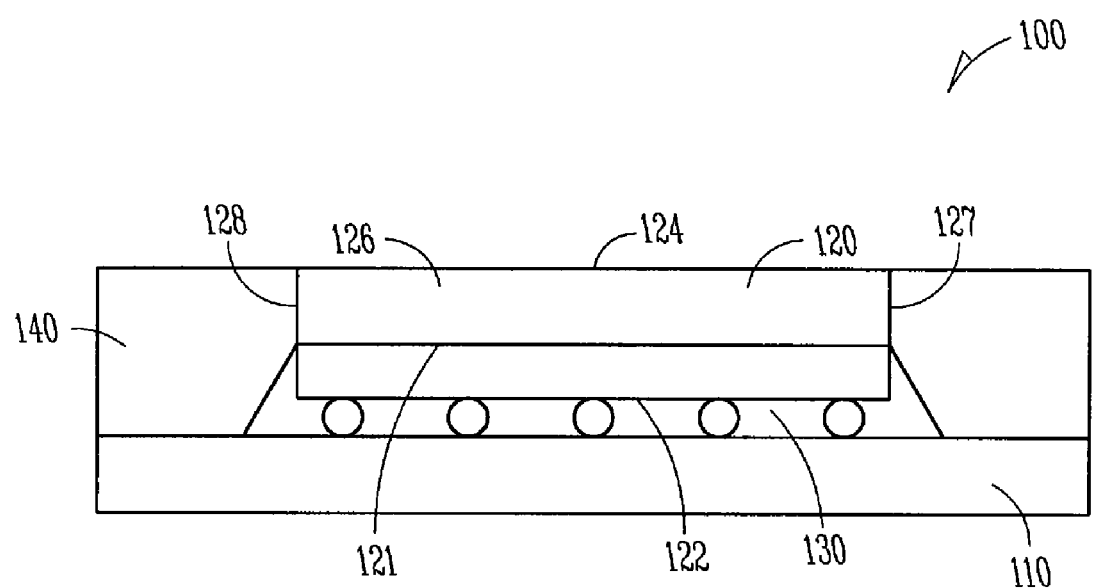
FIG. 1 is schematic cutaway view of a semiconductor package, according to an embodiment of the invention.

The description set out herein illustrates the various embodiments of the invention and such description is not intended to be construed as limiting in any manner.

DETAILED DESCRIPTION

In the following detailed description, reference is made to the accompanying drawings, which are not necessarily to scale, which form a part hereof, and in which is shown, by way of illustration, specific embodiments in which the apparatus and methods can be practiced. These embodiments are described in sufficient detail to enable those skilled in the art to practice them, and it is to be understood that the embodiments can be combined, or that other embodiments can be utilized and that procedural changes can be made without departing from the spirit and scope of the present invention. The following detailed description is, therefore, not to be taken in a limiting sense, and the scope is defined by the appended claims and their equivalents. In the drawings, like numerals describe substantially similar components throughout the several views.

FIG. 1 is schematic cutaway view of a semiconductor package 100, according to an embodiment of the invention. The semiconductor package includes a substrate 110, a die 120 attached to the substrate 110. The die 120 includes an inner layer dielectric (ILD) layer 121 where the devices associated with the die 120 are formed on a wafer before singulating the wafer into individual dies. An underfill material 130 is positioned between the die 110 and the substrate 120. A molding material or molding compound 140 contacts at least a portion of the substrate 110 and the die 120. In some embodiments of the invention, the underfill material 130 positioned between the die 120 and the substrate 110 is different than the molding material or molding compound 140. The die 120 includes a frontside surface 122 near the substrate 110, a backside surface 124, and four sidewall surfaces 126, 127, 128 and one not shown. In some embodiments, the molding material or molding compound 140 contacts the four sidewall surfaces 126, 127, 128 and one not shown. In other embodiments of the invention, the molding material or molding compound 140 contacts the four sidewall surfaces 126, 127, 128 and one not shown and does not contact the backside surface 124 of the die 120. In other words, the backside surface 124 of the die 120 is devoid of the molding material or molding compound 140.

Figure 2A:
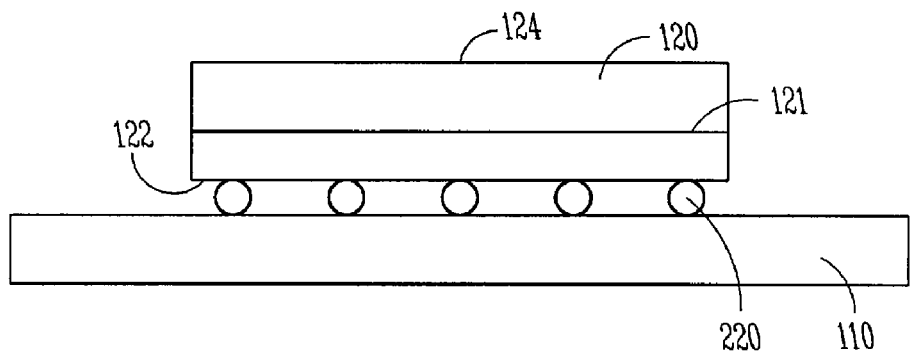
FIG. 2A is schematic cutaway view of a semiconductor package at an initial stage of packaging, according to an embodiment of the invention.
Figure 2B:
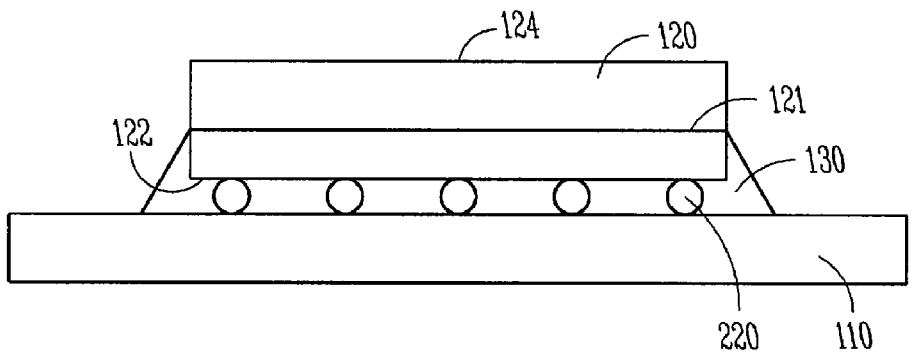
FIG. 2B is schematic cutaway view of a semiconductor package after a capillary underfill is placed between the die and the substrate, according to an embodiment of the invention.
Figure 2C:
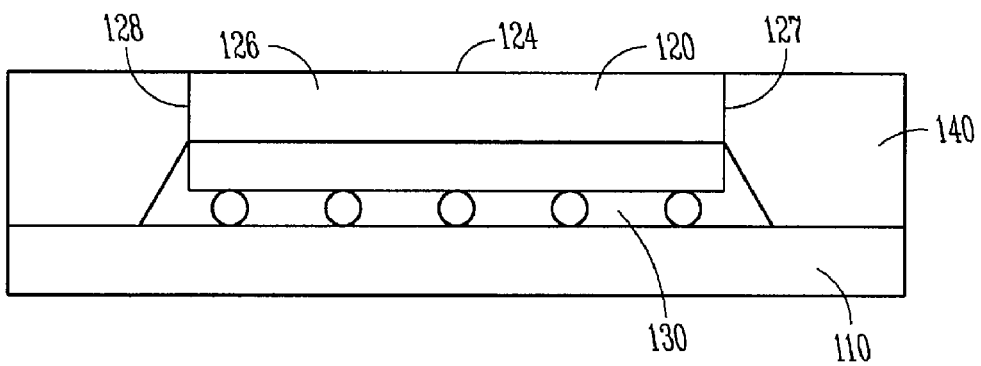
FIG. 2C is schematic cutaway view of a semiconductor package after molding around at least a portion of the substrate and the die, according to an embodiment of the invention.

FIGS. 2A-2C show various schematic cutaway views during the formation of the package 100 shown in FIG. 1. FIG. 2A is schematic cutaway view of a semiconductor package 100 at an initial stage of packaging, according to an embodiment of the invention. Initially, the die 120 is attached to the substrate 110 by reflowing the solder associated with a set of solderballs 220 attached to the die 120. The die and substrate are heated until the solderballs 220 are in a liquid state. The solderballs 220 of the die 120 are positioned in an array. A similar array of pads is set forth on the substrate 110 so that when the solderballs 220 are reflowed, the solder attaches to the pads of the substrate 110, thereby electrically connecting the solderballs 220 to the pads of the substrate 110. This is generally referred to as chip attach and electrically attaches the die 120 to the substrate 110. After chip attach there is a space or gap between the frontside surface 122 of the die 120 and the substrate 110. The solder balls 220 bridge the gap in the form of an array, but do not totally fill the gap. The ILD 121 is fragile and is subject to cracking if certain forces are placed on the die 120 and specifically on the backside surface 124 of the die 120. An underfill 130 can be formed in one of several ways. However, a capillary underfill 130 generally minimizes the force on the die 120 and therefore minimizes the risk of cracking the ILD 121 within the die 120. FIG. 2B is schematic cutaway view of a semiconductor package after a capillary underfill 130 has been placed between the die 120 and the substrate 110. The underfill 130 provides strength to the die 120 since the gap between the die 120 and the substrate 110 is filled. Of course, in other embodiments of the invention, the underfill may be done under pressure, especially if the die 120 is considered capable of withstanding the corresponding forces without cracking the ILD.

The capillary underfill 130 is cured and then at least a portion of the die 120 and the substrate 110 are encapsulated with a molding material or compound 130. FIG. 2C is a schematic cutaway view of a semiconductor package 100 after molding around at least a portion of the substrate 110 and the die 120, according to an embodiment of the invention. The molding material or molding compound 130, as shown in FIG. 2C, contacts the four sidewall surfaces 126, 127, 128 and one not shown and does not contact the backside surface 124 of the die 120, as well as a portion of the underfill material 130. As shown in FIG. 2C, the backside surface 124 of the die 120 is devoid of the molding material or molding compound 140.

Figure 13A:
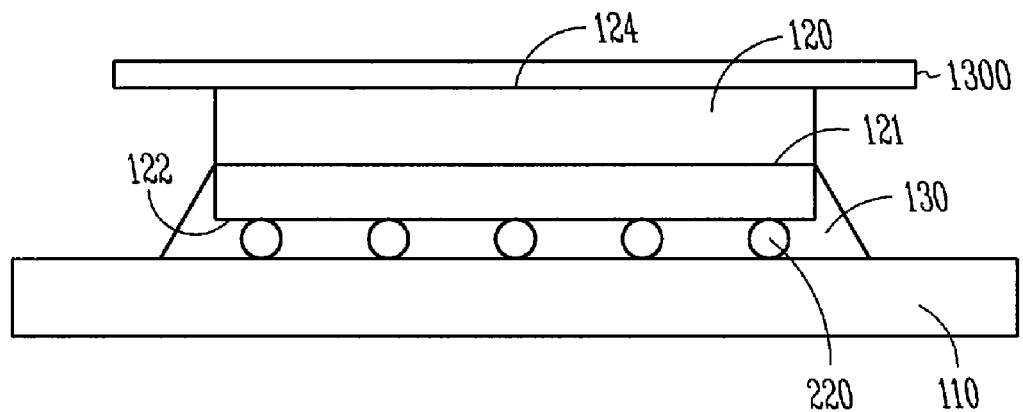
FIG. 13A is a schematic cutaway view of a semiconductor package having a film placed on a backside of the package, according to an example embodiment.
Figure 13B:
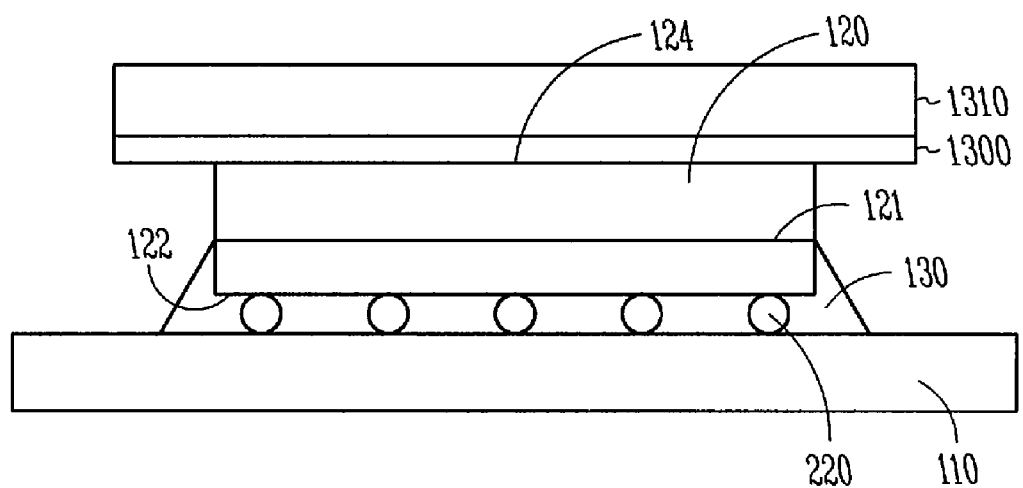
FIG. 13B is a schematic cutaway view of a semiconductor package having a film placed on a backside of the package and having a device applying a force to the film and backside of the package, according to an example embodiment.

FIG. 13A is a schematic cutaway view of a semiconductor package having a film placed on a backside of the package, according to an example embodiment. FIG. 13B is a schematic cutaway view of a semiconductor package having a film placed on a backside of the package and having a device applying a force to the film and backside of the package, according to an example embodiment. FIGS. 13A and 13B show one embodiment of forming the package as shown in FIG. 2C. Now referring to both FIGS. 13A and 13B, the semiconductor package includes a substrate 110, a die 120 attached to the substrate 110. The die 120 includes an inner layer dielectric (ILD) layer 121 where the devices associated with the die 120 are formed on a wafer before singulating the wafer into individual dies. An underfill material 130 is positioned between the die 110 and the substrate 120. The die 120 includes a frontside surface 122 near the substrate 110, a backside surface 124, and four sidewall surfaces 126, 127, 128 and one not shown. In some embodiments, the molding material or molding compound. A film 1300 is placed on the backside surface 124 of the semiconductor package. As shown in FIG. 13B, the film 1300, in some embodiments, is compressed by a device 1310 which places a compression force on the film. The film 1300 substantially prevents the second material or encapsulant from being applied to the backside surface 124 of the semiconductor package. The film is removed to yield the structure shown in FIG. 2C. Of course, in some embodiments, the device 1310 for applying the compression force is removed as part of removing the film 1300.

Figure 3:
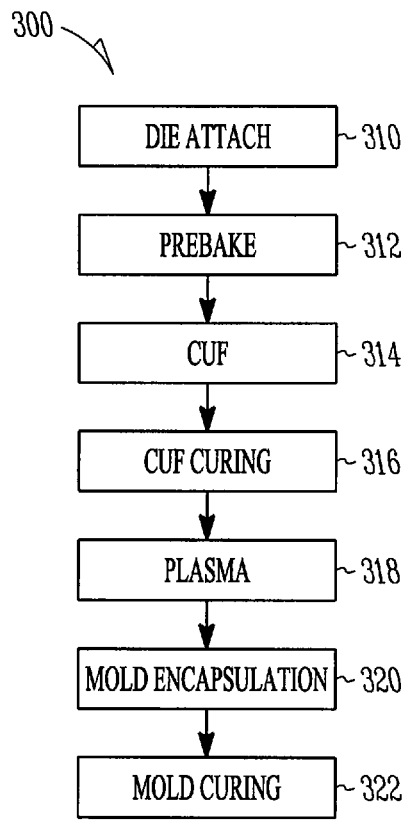
FIG. 3 is a flow chart of a method for forming a semiconductor package, according to an embodiment of the invention.

FIG. 3 is a flow chart of a method 300 for forming a semiconductor package, according to an embodiment of the invention. The method 300 for forming a semiconductor package includes initially attaching the die or chip, as depicted by reference numeral 310. The die is attached to the substrate in the die attach step 310. A prebake 312 is then done after attaching the die to the substrate. After a prebake, a capillary underfill material is placed between the die and the substrate, as depicted by reference numeral 314. Once the capillary underfill 314 is accomplished, the capillary underfill area where the material that is used in the capillary underfill is cured, as depicted by reference numeral 316. After the capillary underfill is cured, a plasma etch takes place, as depicted by reference numeral 318. The next step is mold encapsulation 320 with a molding material or molding compound. The mold material or molding compound is curable and, therefore, after the mold encapsulation step 320, the mold compound or mold material is cured, as depicted by reference numeral 322.

Figure 4:
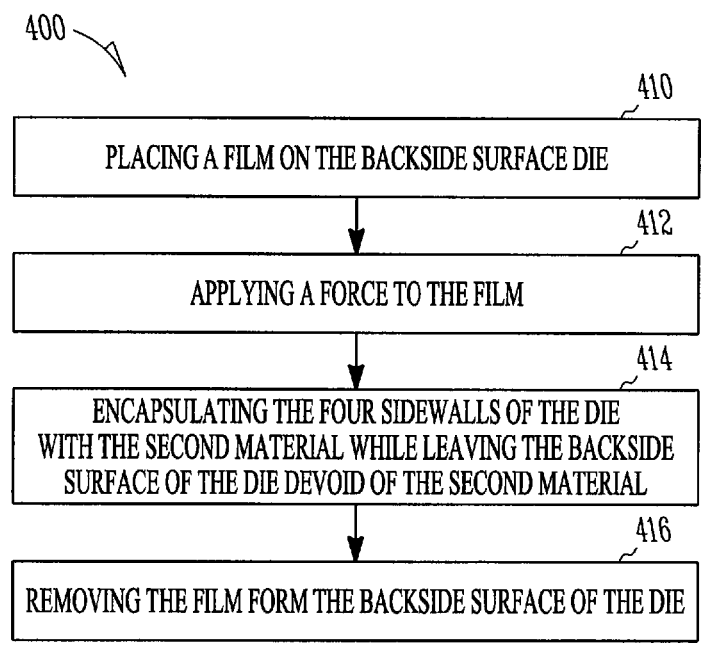
FIG. 4 is a flow chart of a method for forming a semiconductor package wherein the backside surface of the die is devoid of a second, molded material, according to another embodiment of the invention.

FIG. 4 is a flowchart of a method 400 for a mold encapsulation of a semiconductor package, according to yet another embodiment of the invention. Initially a film is placed on the backside surface of the die, as depicted by reference numeral 410. The film that is used is a highly compressible film such as a Teflon film or PTFE. Such highly compressible films are available from specialty polymer companies, such as DUPONT E I DE NEMOURS & CO, DuPont Building, 1007 Market Street, Wilmington, Del. 19898, USA. A force is then applied to the film, as depicted by reference numeral 412. The back side surface of the die can then be compressed or a force can be applied to the backside of the die since the die has previously been under filled using a capillary underfill or other underfill. The process of underfilling stabilizes the die and the ILD within the die so that by applying a force to the film 412, the result will not be cracking or failure of the ILD within the die. Next, the four sidewalls of the die are encapsulated with a second material. The force, or compression force, continues to be applied to the film as the four sidewalls of the die are encapsulated. The film and the compression force applied to it therefore allow encapsulation of the four sidewalls of the die with the second material while leaving the backside surface of the die devoid of the second material, as depicted by reference numeral 414. The next step is removing the film from the backside surface of the die, as depicted by reference numeral 416. The end result is a package that looks similar to the package found in FIGS. 1 or 2C.

Figure 5:
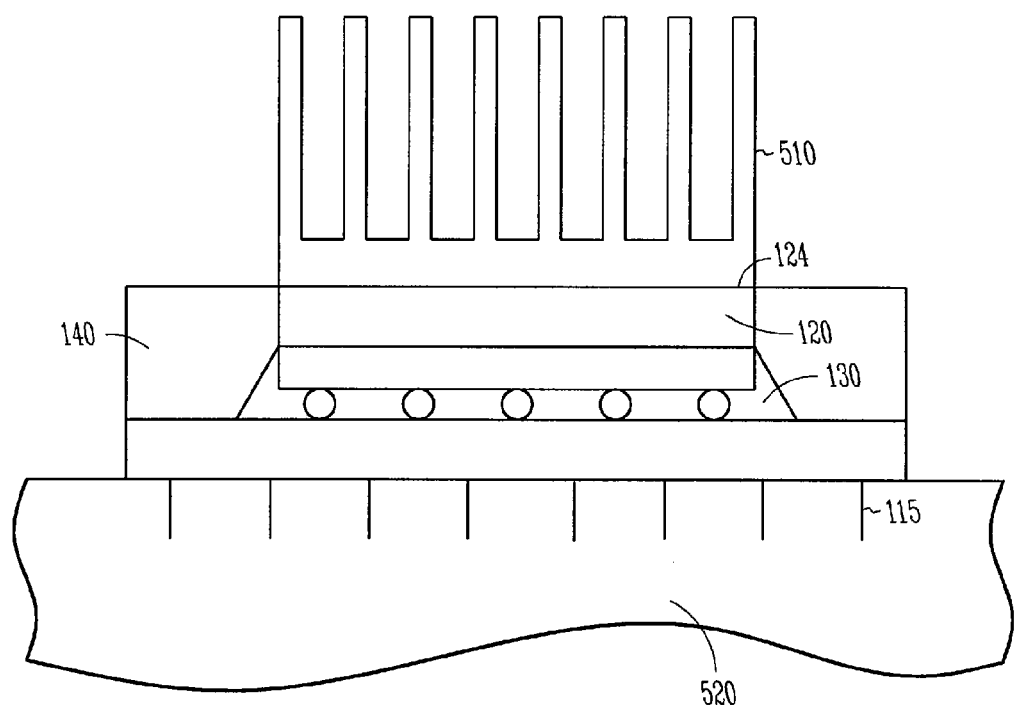
FIG. 5 is a schematic view of a system, according to an embodiment of this invention.

FIG. 5 is a schematic view of a system 500, according to an embodiment of this invention. The system 500 includes a semiconductor package 100 having a substrate 110, a die 120 attached to the substrate, an underfill material 130 positioned between the die 110 and the substrate 120, and a molding material 140 in contact with at least a portion of the substrate 110 and the die 120. A heat sink 510 is also in thermal contact with the backside surface 124 of the semiconductor package 100. Some semiconductor packages 100, such as those associated with microprocessors, generate enough heat so that the heat sink 510 must be used to remove heat from the semiconductor package and prevent the die from failing. The heat sink 510 is attached to the backside surface of the die. In some embodiments, a thermally conductive material, such as a thermal grease or thermal adhesive, is located between the backside surface 124 of the die 120 and the heat sink 510. The system 500 also includes a printed circuit board 520. The semiconductor package 100 includes a set of pins 115 is attached to the printed circuit board 520. In some embodiments, the molding material 130 contacts the four sidewall surfaces 126, 27, 128 and one not shown and the backside surface.

Figure 6:
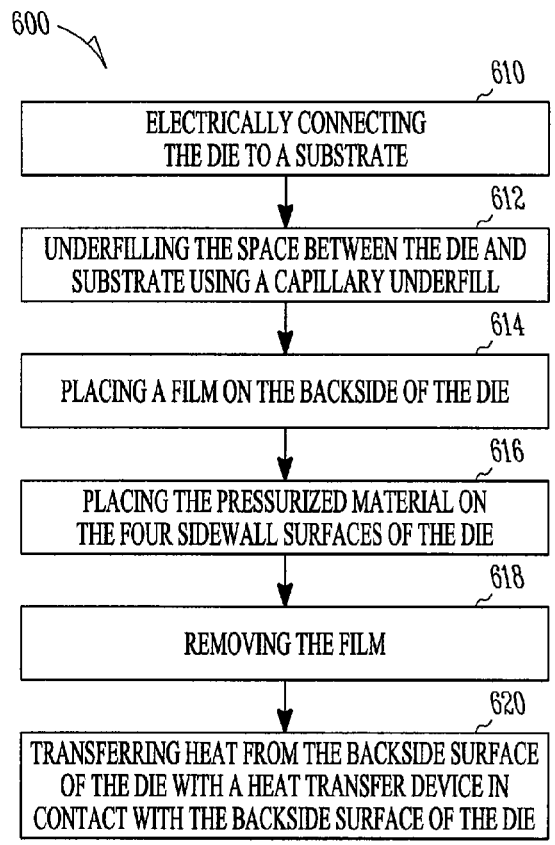
FIG. 6 is a method of forming a system, according to an embodiment of this invention.

FIG. 6 is a method 600 for forming a system 500, according to an embodiment of this invention. The method 600 of packaging a die includes electrically connecting the die to a substrate 610, and underfilling the space between the die and the substrate using a capillary underfill 612. The die includes a backside surface and four sidewall surfaces. A compressible film is placed on the backside of the die 614. The film is compressed, and the pressurized material or molding compound is then placed in contact on the four sidewall surfaces of the die 616. The compressible film is removed 618 and a heat transfer device is placed in contact with the die, thereby transferring heat from the backside surface of the die with a heat transfer device in contact with the backside surface of the die 620. The pressurized material, in some embodiments, is a heated epoxy, phenolic or novalac resin. The film is removed after the heated epoxy is cured.

Figure 7:
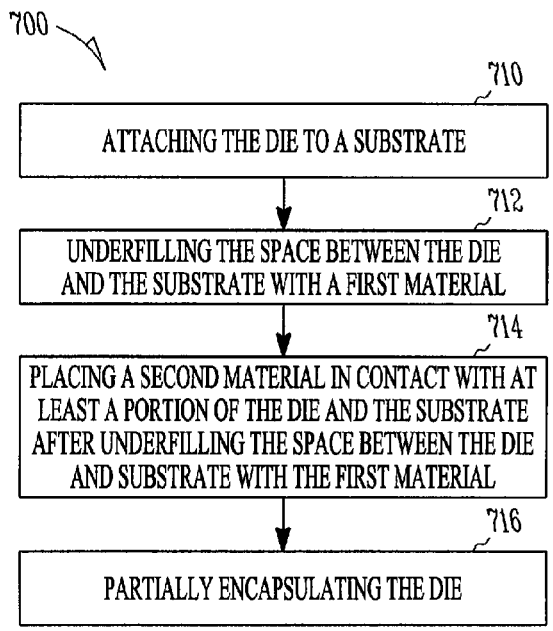
FIG. 7 is a method for forming a semiconductor package, according to an embodiment of this invention.

FIG. 7 is a method 700 for forming a semiconductor package, according to an embodiment of this invention. The method 700 includes attaching the die to the substrate 710 and underfilling the space between the die and the substrate with a first material 712. A second material is placed in contact with at least a portion of the die and the substrate after underfilling the space between the die and the substrate with the first material, as depicted by reference numeral 714. This is followed by partially encapsulating the die 716. Thus, according to this embodiment, the die is only partially encapsulated in this method.

Figure 8:
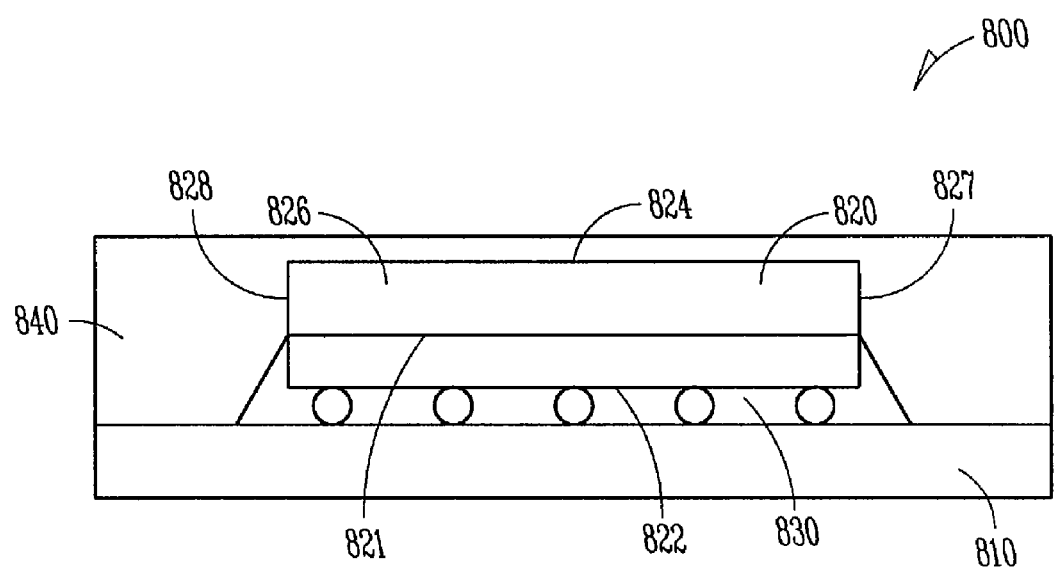
FIG. 8 is a schematic cutaway view of a semiconductor package, according to another embodiment of the invention.

FIG. 8 is a schematic view of a semiconductor package 800, according to another embodiment of this invention. The semiconductor package 800 includes a substrate 810 and a die 820. The die 820 is attached to the substrate 810. The die 820 includes an inner dielectric layer (ILD) 821 where the device associated with the die are formed on a wafer before singulating the wafer into individual dies. An underfill material 830 is positioned between the die 810 and the substrate 820. A molding material or molding compound 840 contacts the substrate 810 and encapsulates the die 820. The die includes a front side surface 822 positioned near the substrate 810, a backside surface 824, and four sidewall surfaces 826, 827, 828 and one not shown. As shown in FIG. 8, the molding material contacts the four sidewall surfaces 826, 828, 827 and one not shown, as well as the backside surface 824 of the die 820. Therefore, the backside surface 824 of the die 820 is covered with molding material or molding compound 840 in this particular embodiment of the invention.

Figure 9:
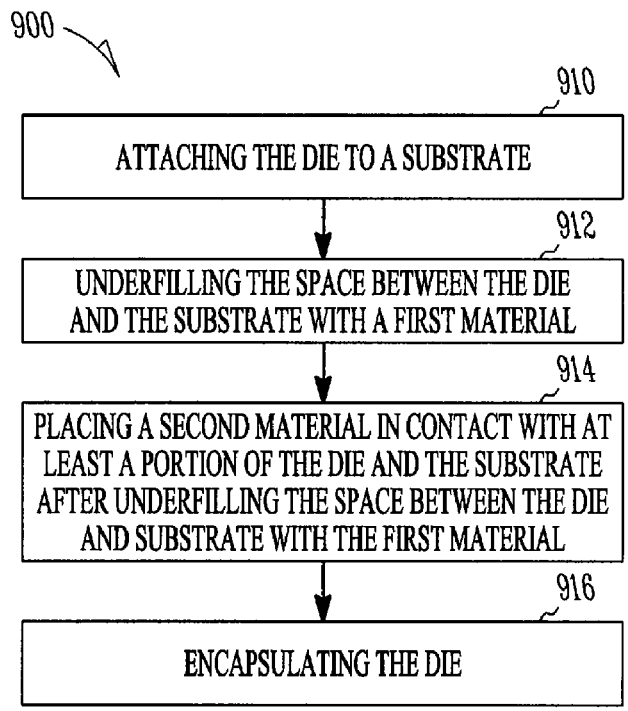
FIG. 9 is a flow chart of a method for forming a semiconductor package, according to an embodiment of this invention.

FIG. 9 is a flowchart of a method 900 for forming a semiconductor package, according to an embodiment of this invention. The method 900 includes attaching the die to the substrate 910 and underfilling the space between the die and the substrate with a first material 912. The second material is placed in contact with at least a portion of the die and the substrate after underfilling the space between the die and the substrate with the first material, as depicted by reference numeral 914 to encapsulate the die 916. The second material is placed in contact with the backside surface 824, as well as the sidewall surfaces 826, 827, 828 and one not shown of the die 820. Encapsulating the die is referenced by reference numeral 916.

Figure 10:
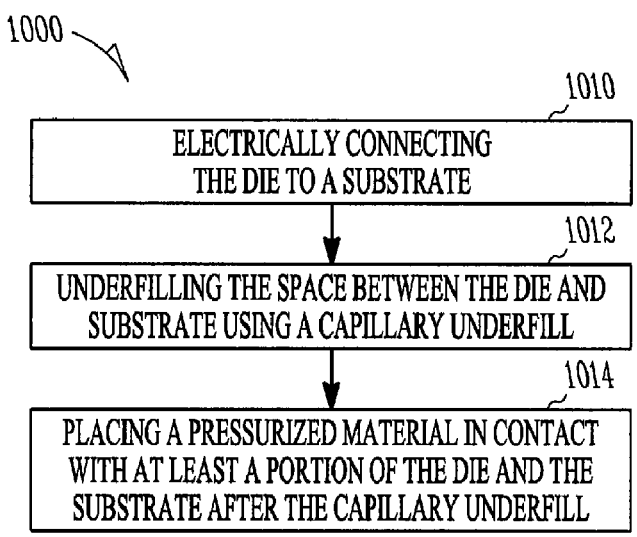
FIG. 10 is a flow chart of a method, according to an embodiment of this invention.

FIG. 10 is a flowchart of a method 1000, according to an embodiment of the invention. The method 1000 includes electrically connecting the die to the substrate 1010, underfilling the space between the die and the substrate using a capillary underfill 1012, and placing a pressurized material in contact with at least a portion of the die and the substrate after the capillary underfill 1014.

A method of packaging a die includes electrically connecting the die to a substrate, underfilling the space between the die and the substrate using a capillary underfill, and placing a pressurized material in contact with at least a portion of the die and the substrate after the capillary underfill. The die includes a backside surface and four sidewall surfaces. Placing a pressurized material in contact with at least a portion of the die and the substrate after the capillary underfill includes encapsulating the backside surface and the four sidewall surfaces with the pressurized material. In some embodiments of the invention, the pressurized material is a heated epoxy, phenolic or novalac resin. In some embodiments, the heated epoxy, phenolic or novalac resin is a different material than a material associated with underfilling the space between the substrate and the die. In some embodiments, placing a pressurized material in contact with at least a portion of the die and the substrate after the capillary underfill excludes placing the pressurized material on the backside surface of the die. In still other embodiments, placing a pressurized material in contact with at least a portion of the die and the substrate after the capillary underfill includes placing a film on the backside of the die, and placing the pressurized material on the four sidewall surfaces of the die. In still other embodiments, placing a pressurized material in contact with at least a portion of the die and the substrate after the capillary underfill further includes placing a film on the backside of the die, pressurizing the film, placing the pressurized material on the four sidewall surfaces of the die, and removing the film. The pressurized material, in some embodiments, is a heated epoxy. The film is removed after the heated epoxy is cured. The method further includes transferring heat from the backside surface of the die with a heat transfer device in contact with the backside surface of the die.

A method of packaging a die includes attaching the die to a substrate; underfilling the space between the die and the substrate with a first material, and placing a second material in contact with at least a portion of the die and the substrate after underfilling the space between the die and substrate with the first material. In some embodiments, the first material is a curable epoxy. In still other embodiments, a capillary action of the first material is used in underfilling the space between the die and the substrate. In other embodiments of the invention, the second material is a heated epoxy, phenolic or novalac resin. In some embodiments of the invention, placing a second material in contact with at least a portion of the die and the substrate includes encapsulating the die. Placing a second material in contact with at least a portion of the die and the substrate includes partially encapsulating the die. Partially encapsulating the die includes placing a film on the backside surface of the die, applying a force to the film, and encapsulating the four sidewalls of the die with the second material while leaving the backside surface of the die devoid of the second material. The method also includes removing the film from the backside surface of the die. In some embodiments, placing a second material in contact with at least a portion of the die and the substrate includes leaving the backside surface of the die devoid of the second material.

Figure 11:
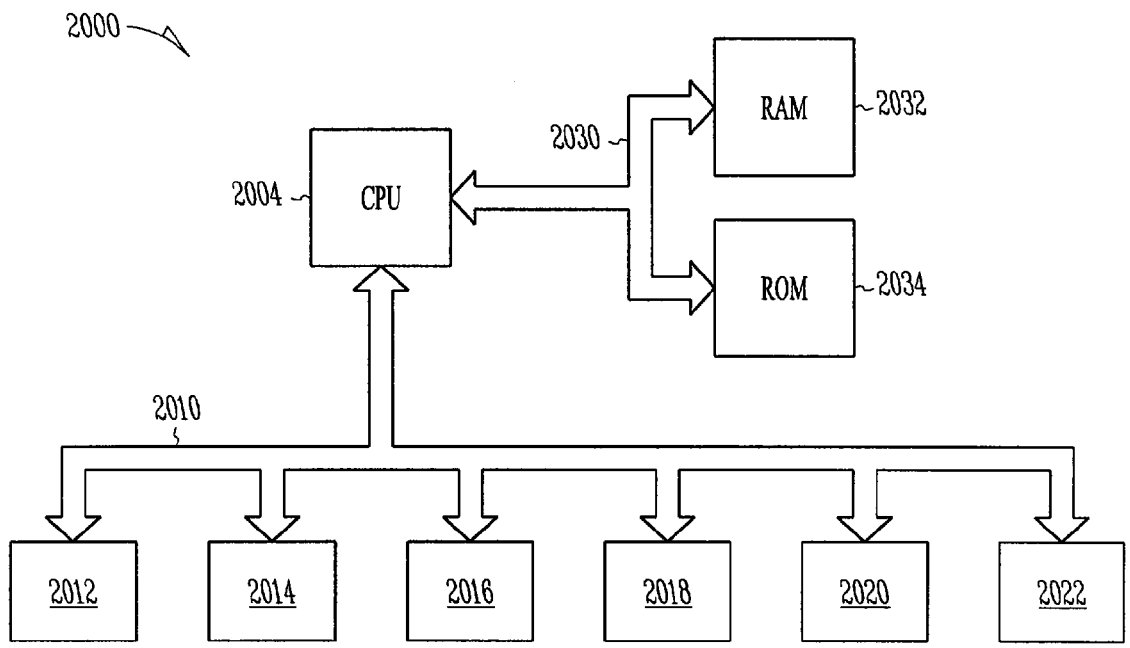
FIG. 11 is a schematic diagram of a computer system that can be used to control the apparatus for attaching the semiconductor package and curing a material in contact with the package, according to an embodiment of this invention.

A computer system can be used to control packaging apparatus to implement the methods 300, 400, 600, 700, 900, and 1000 set forth above. FIG. 11 is a schematic diagram of a computer system 2000 that can be used to implement the methods 300, 400, 600, 700, 900, and 1000. The computer system 2000 may also be called an electronic system or an information handling system. The computer or information handling system includes a central processing unit 2004, a random access memory 2032, and a system bus 2030 for communicatively coupling the central processing unit 2004 and the random access memory 2032. The information handling system 2002 also includes an input/output bus 2010 and several devices peripheral devices, such as 2012, 2014, 2016, 2018, 2020, and 2022 maybe attached to the input output bus 2010. Peripheral devices may include hard disc drives, magneto optical drives, floppy disc drives, monitors, keyboards and other such peripherals.

Figure 12:
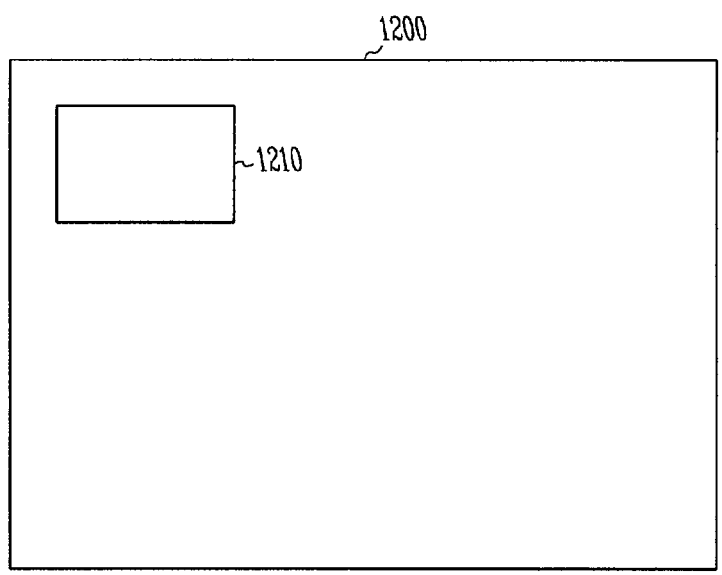
FIG. 12 is a block diagram of a computer-readable medium that includes an instruction set therein, according to an embodiment of this invention.

FIG. 12 is a block diagram of a computer-readable medium 1200 that includes an instruction set 1210 therein. The computer-readable medium can be any type of memory, a disk used for magnetic disk storage, optical disk storage, flash memory devices, or other machine-readable media. Media can also be read-only memory or random-access memory, which is part of a hardware configuration for a computer system. Furthermore, the media can also include the internet, storage available to a server, or a transmission of any sort, connected or wireless, that is used to transmit the instructions to a computer system.

A computer program product for use with a computer system associated with a device such as a set of stations in a semiconductor packaging operation, the computer program product includes a computer usable medium that causes a computer to execute the methods and processes set forth in FIGS. 2-4 above. In other words, a set of instructions 910 associated with the computer program product and executable by a suitably programmed information handling system and embodied in the computer usable medium causes the computer system 800 to execute the methods and processes set forth in FIGS. 2-4 and detailed in the above paragraphs.

It is to be understood that the above description is intended to be illustrative and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of packaging a die comprising:
   electrically connecting the die to a substrate;
   underfilling the space between the die and the substrate using a capillary underfill;
   placing a compressible film onto a backside surface of the die;
   compressing the film; and
   placing a pressurized material in contact with at least a portion of the die and the substrate after the capillary underfill.

2. The method of claim 1 further comprising removing the compressible film.

3. The method of claim 2 wherein the pressurized material is a different material than a material associated with underfilling the space between the substrate and the die.

4. The method of claim 1 wherein the pressurized material associated with placing a pressurized material in contact with at least a portion of the die is a different material than a material associated with underfilling the space between the substrate and the die.

5. The method of claim 1 further comprising etching the device.

6. The method of claim 1 further comprising:
   allowing the underfill material to at least partially cure; and
   etching the device.

7. The method of claim 1 further comprising placing a heat sink in thermal communication with the die.

8. A method of packaging a die comprising:
   electrically connecting the die to a substrate;
   underfilling the space between the die and the substrate using a capillary underfill; and
   placing a pressurized material in contact with at least a portion of the die and the substrate after the capillary underfill, wherein the die includes a backside surface and four sidewall surfaces, wherein placing a pressurized material in contact with at least a portion of the die and the substrate after the capillary underfill excludes placing the pressurized material on the backside surface of the die.

9. The method of claim 8 wherein placing a pressurized material in contact with at least a portion of the die and the substrate after the capillary underfill further includes:
   placing a film on the backside of the die; and
   placing the pressurized material on the four sidewall surfaces of the die.

10. The method of claim 8 wherein placing a pressurized material in contact with at least a portion of the die and the substrate after the capillary underfill further includes:
    placing a film on the backside of the die;
    pressurizing the film;
    placing the pressurized material on the four sidewall surfaces of the die; and
    removing the film.

11. The method of claim 10 wherein the pressurized material is a heated epoxy and wherein the film is removed after the heated epoxy is cured.

12. The method of claim 10 further comprising transferring heat from the backside surface of the die with a heat transfer device in contact with the backside surface of the die.

13. The method of claim 8 further comprising placing a thermally conductive material onto the backside surface of the die.

14. The method of claim 8 further comprising:
placing a thermally conductive material onto the backside surface of the die; and
placing a heat sink onto the thermally conductive material.

15. The method of claim 8 further comprising placing a heat sink in thermal communication with the backside surface of the die.

16. The method of claim 8 further comprising placing another encapsulating material onto the backside surface of the die.

17. A method of packaging a die comprising:
attaching the die to a substrate;
underfilling the space between the die and the substrate with a first material; and
placing a second material in contact with at least a portion of the die and the substrate after underfilling the space between the die and substrate with the first material, wherein placing a second material in contact with at least a portion of the die and the substrate includes partially encapsulating the die and, wherein the die includes a backside surface and at least four sidewall surfaces, wherein partially encapsulating the die includes:
placing a film on the backside surface of the die;
applying a force to the film; and
encapsulating the four sidewalls of the die with the second material while leaving the backside surface of the die devoid of the second material.

18. The method of claim 17 wherein the first material is a curable epoxy.

19. The method of claim 17 wherein a capillary action of the first material is used in underfilling the space between the die and the substrate.

20. The method of claim 17 wherein the second material is a curable epoxy.

21. The method of claim 17 wherein placing a second material in contact with at least a portion of the die and the substrate includes encapsulating the die.

22. The method of claim 17 further including removing the film from the backside surface of the die.

23. The method of claim 17 wherein the die includes a backside surface and at least four sidewall surfaces, wherein placing a second material in contact with at least a portion of the die and the substrate includes leaving the backside surface of the die devoid of the second material.

24. The method of claim 17 further comprising placing a heat sink in thermal communication with the backside surface of the die.

25. The method of claim 17 further comprising:
placing a thermally conductive material on the backside surface of the die; and
placing a heat sink onto the conductive material.

26. The method of claim 17 further comprising etching the device.

27. The method of claim 17 wherein placing a second material in contact with at least a portion of the die and the substrate further includes pressurizing the second material.

* * * * *